(12) United States Patent
Lee et al.

(10) Patent No.: US 11,495,778 B2
(45) Date of Patent: Nov. 8, 2022

(54) LIGHT EMITTING DIODE COMPRISING LOW REFRACTIVE EMISSION LAYER AND DISPLAY DEVICE INCLUDING THE SAME

(71) Applicant: Samsung Display Co., Ltd., Yongin-si (KR)

(72) Inventors: Bora Lee, Hwaseong-si (KR); Hyomin Ko, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 17/093,284

(22) Filed: Nov. 9, 2020

(65) Prior Publication Data

US 2021/0280831 A1 Sep. 9, 2021

(30) Foreign Application Priority Data

Mar. 3, 2020 (KR) .................. 10-2020-0026766

(51) Int. Cl.
*H01L 51/50* (2006.01)
*H01L 27/32* (2006.01)
*H01L 51/52* (2006.01)

(52) U.S. Cl.
CPC ...... *H01L 51/5265* (2013.01); *H01L 51/5004* (2013.01); *H01L 51/5012* (2013.01); *H01L 51/5056* (2013.01); *H01L 51/5064* (2013.01); *H01L 27/3211* (2013.01); *H01L 51/5218* (2013.01); *H01L 2251/5315* (2013.01); *H01L 2251/558* (2013.01)

(58) Field of Classification Search
None
See application file for complete search history.

(56) References Cited

U.S. PATENT DOCUMENTS

| 8,102,118 | B2 | 1/2012 | Lee et al. | |
|---|---|---|---|---|
| 8,680,542 | B2 | 3/2014 | Kurata et al. | |
| 9,293,732 | B2 | 3/2016 | Pyo et al. | |
| 2013/0334547 | A1* | 12/2013 | Yoneda | H01L 33/24 257/89 |
| 2014/0070196 | A1* | 3/2014 | Kim | H01L 51/504 257/40 |
| 2015/0102307 | A1 | 4/2015 | Tajima et al. | |
| 2017/0294627 | A1* | 10/2017 | Kim | H01L 51/5253 |
| 2020/0006439 | A1* | 1/2020 | Sun | H01L 51/508 |

FOREIGN PATENT DOCUMENTS

| JP | 4788407 B2 | 10/2011 |
|---|---|---|
| KR | 10-1330912 B1 | 11/2013 |
| KR | 10-1434361 B1 | 8/2014 |
| WO | WO 2013/128601 A1 | 9/2013 |

\* cited by examiner

*Primary Examiner* — Daniel Whalen
(74) *Attorney, Agent, or Firm* — Lewis Roca Rothgerber Christie LLP

(57) ABSTRACT

A light emitting diode of an embodiment of the present disclosure includes a first electrode, a hole transport region on an upper portion of the first electrode and having a first refractive index, an emission layer on an upper portion of the hole transport region and having a second refractive index less than the first refractive index, an electron transport region on an upper portion of the emission layer, and a second electrode on an upper portion of the electron transport region.

18 Claims, 7 Drawing Sheets

LIGHT EMITTING DIODE COMPRISING LOW REFRACTIVE EMISSION LAYER AND DISPLAY DEVICE INCLUDING THE SAME

CROSS-REFERENCE TO RELATED APPLICATION

This application claims priority to and the benefit of Korean Patent Application No. 10-2020-0026766, filed on Mar. 3, 2020, the entire contents of which are hereby incorporated by reference.

BACKGROUND

1. Field

Embodiments of the present disclosure relate to a light emitting diode and a display device including the same, and, for example, to a light emitting diode containing a low refractive emission layer and a display device including the same.

2. Description of the Related Art

Various display devices such as televisions, mobile phones, tablet computers, navigation devices, and game consoles used in multimedia devices are being developed. These display devices use so-called self-luminescent display diodes in which a luminescent material including an organic compound, a quantum dot, and/or the like in the emission layer between facing electrodes emits light to implement display.

In the application of a light emitting diode in a display device, there is a demand for a light emitting diode having high luminous efficiency, and a long service life, and development on a structure for a light emitting diode capable of stably attaining such characteristics is being continuously investigated.

SUMMARY

Embodiments of the present disclosure provides a light emitting diode that exhibits excellent light extraction efficiency.

Embodiments of the present disclosure also provide a display device including a light emitting diode having high luminous efficiency.

An embodiment of the present disclosure provides a light emitting diode including: a first electrode; a hole transport region on an upper portion of the first electrode and having a first refractive index; an emission layer on an upper portion of the hole transport region and having a second refractive index less than the first refractive index; an electron transport region on an upper portion of the emission layer; and a second electrode on an upper portion of the electron transport region.

In an embodiment, the difference between the first refractive index and the second refractive index may be greater than 0.1.

In an embodiment, the first refractive index may be 1.7 to 2.2, and the second refractive index may be 1.2 to 1.7.

In an embodiment, the emission layer may include an organic material and an organic emitting material having a refractive index of 1.2 to 1.7.

In an embodiment, the emission layer may include a first emission layer directly on an upper portion of the hole transport region and a second emission layer on an upper portion of the first emission layer, wherein the first emission layer may have the second refractive index.

In an embodiment, the second emission layer may have a third refractive index, wherein the third refractive index may be equal to or greater than the second refractive index.

In an embodiment, the third refractive index may be in a range of 1.2 to 2.0.

In an embodiment, the thickness ratio of the first emission layer to the second emission layer may be in a range of 1:9 to 9:1.

In an embodiment, the sum of the thickness of the first emission layer and the thickness of the second emission layer may be in a range of 10 nm to 60 nm.

In an embodiment, the first emission layer and the second emission layer may emit light having the same center wavelength.

In an embodiment, the hole transport region may include a first hole transport layer directly on a lower portion of the emission layer and a second hole transport layer on a lower portion of the first hole transport layer, wherein the first hole transport layer may have the first refractive index.

In an embodiment, the first electrode may be a reflective electrode, and the second electrode may be a transmissive electrode or a transflective electrode.

In an embodiment, the light emitting diode may further include a capping layer on an upper portion of the second electrode.

An embodiment of the present disclosure provides a light emitting diode including: a first electrode; a hole transport region on an upper portion of the first electrode and having a first refractive index; a first emission layer on an upper portion of the hole transport region and having a second refractive index; a second emission layer on an upper portion of the first emission layer; an electron transport region on an upper portion of the second emission layer; and a second electrode on an upper portion of the electron transport region, wherein the first refractive index is greater than the second refractive index by 0.1 or more.

An embodiment of the present disclosure provides a display device including a plurality of light emitting diodes, each of the light emitting diodes including: a first electrode; a hole transport region on an upper portion of the first electrode and having a first refractive index; an emission layer on an upper portion of the hole transport region and having a second refractive index less than the first refractive index; an electron transport region on an upper portion of the emission layer; and a second electrode on an upper portion of the electron transport region, wherein each of the light emitting diodes emits light having different center wavelengths.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
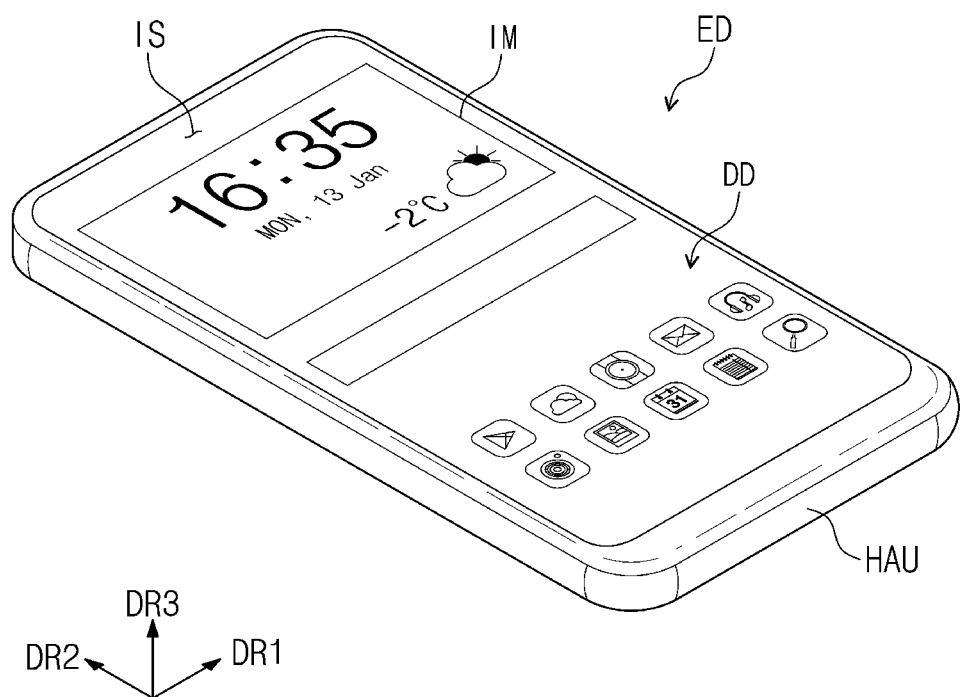
FIG. 1 is a perspective view illustrating an electronic device according to an embodiment of the present disclosure.

The subject matter of the present disclosure may have various modifications and may be embodied in different forms, and example embodiments will be explained in more detail with reference to the accompanying drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the appended claims.

In the present description, it will be understood that when an element (a region, a layer, a section, or the like) is referred to as being "on," "connected to," or "coupled to" another element, it can be directly on, connected or coupled to the other element, or an intervening third element may be therebetween.

Like numbers refer to like elements throughout. Also, in the drawings, the thickness, the ratio, and the dimensions of elements may be exaggerated for an effective description of technical contents.

The term "and/or," includes all combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise," or "have" are intended to specify the presence of stated features, integers, acts, operations, elements, components, or combinations thereof in the disclosure, but do not preclude the presence or addition of one or more other features, integers, acts, operations, elements, components, or combinations thereof.

In the present description, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the present description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other.

In the present description, examples of the halogen atom may include a fluorine atom, a chlorine atom, a bromine atom, and an iodine atom.

In the present description, the alkyl group may be a linear, branched or cyclic alkyl group. The number of carbons in the alkyl group may be 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the present description, the term "aryl group" means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., but the aryl group is not limited thereto.

In the present description, the fluorenyl group may be substituted, and two substituents may be combined with each other to form a spiro structure. Examples of the substituted fluorenyl group are as follows:

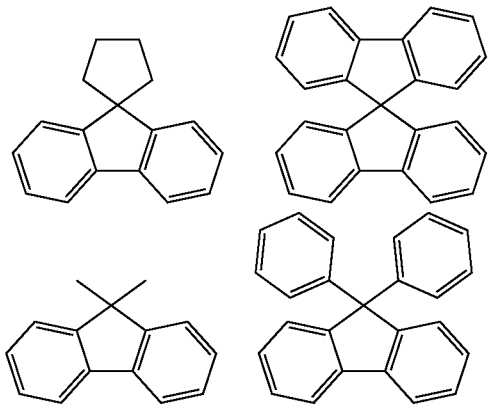

However, an embodiment of the present disclosure is not limited thereto.

In the present description, the heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, phenothiazolyl, phenothiazinyl, dibenzosilole, dibenzofuranyl, etc., but the heteroaryl group is not limited thereto.

In the present description, the above description with respect to the aryl group may be applied to an arylene group except that the arylene group is a divalent group. The above description with respect to the heteroaryl group may be applied to a heteroarylene group except that the heteroarylene group is a divalent group.

In the present description, the silyl group includes an alkyl silyl group and an aryl silyl group. Examples of the silyl group may include, but are not limited to, trimethylsilyl, triethylsilyl, t-butyldimethylsilyl, vinyldimethylsilyl, propyldimethylsilyl, triphenylsilyl, diphenylsilyl, phenylsilyl, etc.

In the present description, the number of carbon atoms in an amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenylamino group, a naphthylamino group, a 9-methyl-anthracenylamino group, a triphenylamino group, etc., but are not limited thereto.

In the present description, the term "substituted or unsubstituted" may indicate that one is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or a phenyl group substituted with a phenyl group.

Hereinafter, a light emitting diode and a display device including the same according to an embodiment of the present disclosure will be described with reference to the drawings.

Figure 2:
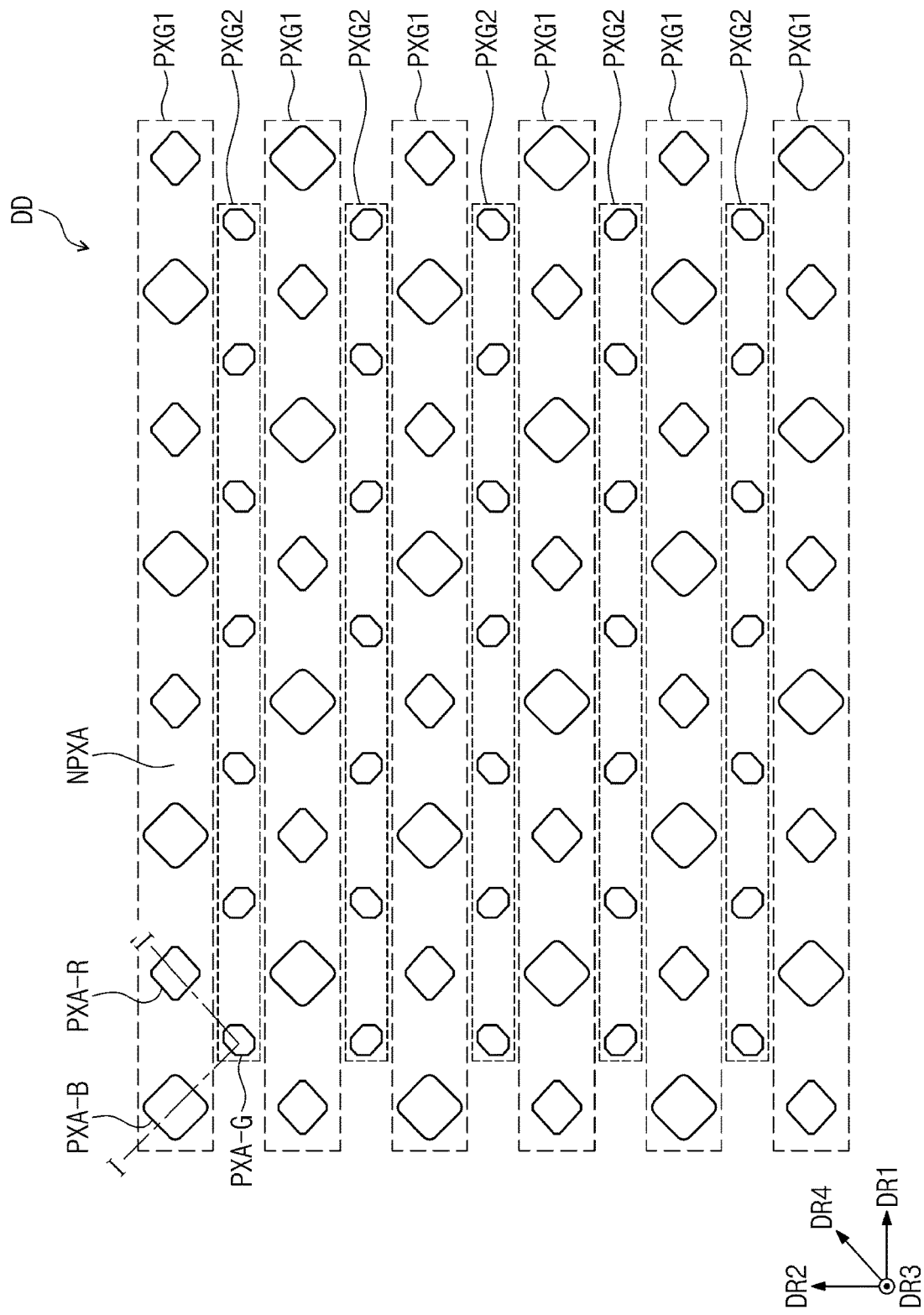
FIG. 2 is a plan view of a display device according to an embodiment of the present disclosure.
Figure 3:
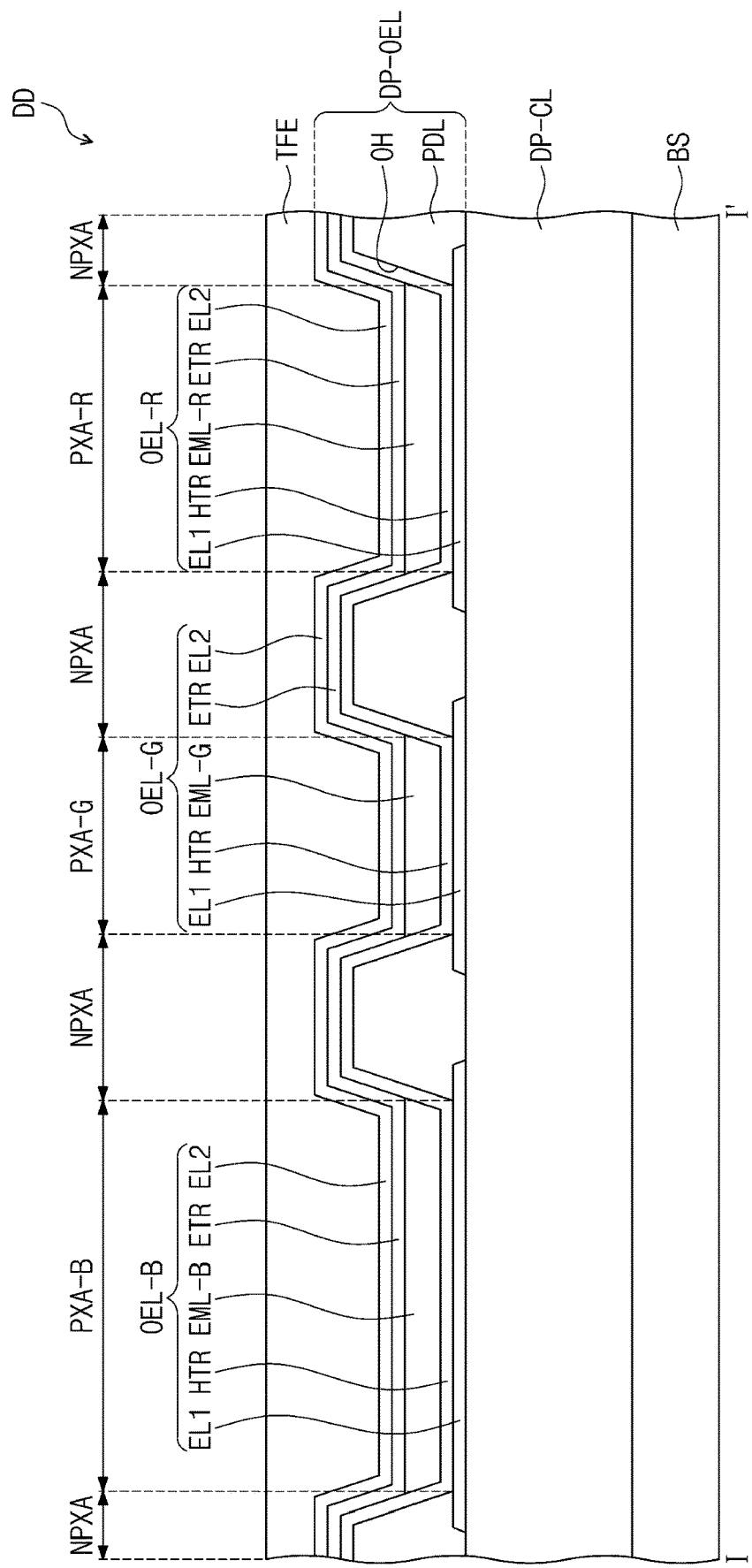
FIG. 3 is a cross-sectional view of the display device, taken along line I-I' of FIG. 2.

FIG. 1 is a perspective view illustrating an electronic device ED according to an embodiment of the present disclosure. FIG. 2 is a plan view of a display device DD according to an embodiment of the present disclosure. FIG. 3 is a cross-sectional view of the display device DD according to an embodiment of the present disclosure. FIG. 3 is a cross-sectional view illustrating a portion of the display device DD, taken along line I-I' of FIG. 2.

In an embodiment, the electronic device ED may be a small-to-medium scale electronic device, such as a smart phone, a tablet, a personal computer, a laptop computer, a personal digital terminal, a vehicle navigation unit, a game console, and/or a camera. In addition, the electronic device ED may be a large scale electronic device, such as a television, a monitor, and/or an outdoor advertising board. The foregoing are merely provided as embodiments, and thus, other electronic devices may be employed within the spirit and scope of the present disclosure.

The electronic device ED may include a display device DD and a housing HAU. The display device DD may display an image IM through a display surface IS. In FIG. 1, the display surface IS is illustrated parallel to a plane defined by a first directional axis DR1 and a second directional axis DR2 crossing the first directional axis DR1. However, this is merely an example, and in another embodiment, a display surface IS of a display device DD may have a curved shape.

A normal direction of the display surface IS, that is, a direction in which the image IM is displayed in a thickness direction of the display device DD, is indicated as a third directional axis DR3. A front surface (or a top surface) and a rear surface (or a bottom surface) in each of the members may be distinguished by the third directional axis DR3. However, directions indicated as the first to third directional axes DR1, DR2, and DR3 may be relative concepts, and thus, may be changed to other directions.

The housing HAU may receive or accommodate the display device DD. The housing HAU may cover or house the display device DD such that the top surface, e.g., the display surface IS of the display device DD is exposed. The housing HAU may cover the side surface and the bottom surface of the display device DD and may expose the entire top surface thereof. However, the embodiments are not limited thereto, and the housing HAU may cover a portion of the top surface of the display device DD as well as the side surface and the bottom surface thereof.

Referring to FIGS. 2 and 3, the display device DD may include non-light emitting areas NPXA and light emitting areas PXA-B, PXA-G, and PXA-R. The light emitting areas PXA-R, PXA-G, and PXA-B may be an area in which light generated from light emitting diodes OEL-R, OEL-G, and OEL-B is emitted, respectively. The light emitting areas PXA-R, PXA-G, and PXA-B may be spaced apart from each other on a plane.

Each of the light emitting areas PXA-R, PXA-G, and PXA-B may be an area divided by (or defined by) a pixel defining film PDL. The non-light emitting areas NPXA may be areas respectively between the adjacent light emitting areas PXA-R, PXA-G, and PXA-B, and may correspond to the pixel defining film PDL. In the present description, each of the light emitting areas PXA-R, PXA-G, and PXA-B may correspond to a pixel. The pixel defining film PDL may divide (or define) the light emitting diodes OEL-R, OEL-G, and OEL-B. The emission layers EML-R, EML-G, EML-B of the light emitting diodes OEL-R, OEL-G, and OEL-B may be divided by being in the opening holes OH defined in the pixel defining film PDL. The emission layers EML-R, EML-G, and EML-B divided by the pixel defining film PDL may be formed by means of a method such as an inkjet printing method.

The light emitting areas PXA-R, PXA-G, and PXA-B may be divided into a plurality of groups according to colors of light generated from the light emitting diodes OEL-R, OEL-G, and OEL-B. In the display device DD of an embodiment shown in FIGS. 2 and 3, three light emitting areas PXA-R, PXA-G, and PXA-B which emit red light, green light, and blue light, respectively, are illustrated as an example. For example, the display device DD of an embodiment may include a red light emitting area PXA-R, a green light emitting area PXA-G, and a blue light emitting area PXA-B which are different from each other.

The display device DD according to an embodiment may include a plurality of light emitting diodes OEL-R, OEL-G, and OEL-B, the red light emitting area PXA-R, and the green light emitting area PXA-G, and the blue light emitting area PXA-B of the display device DD may correspond to a first light emitting diode OEL-R, a second light emitting diode OEL-G, and a third light emitting diode OEL-B, respectively.

In an embodiment, a plurality of light emitting diodes OEL-R, OEL-G, and OEL-B may emit light having different center wavelengths. In the display device DD of an embodiment, the first light emitting diode OEL-R may emit red light, e.g., light having a center wavelength of about 625 nm to about 675 nm, the second light emitting diode OEL-G may emit green light, e.g., light having a center wavelength of about 500 nm to about 570 nm, and the third light emitting diode OEL-B may emit blue light, e.g., light having a center wavelength of about 410 nm to about 480 nm. However, the present disclosure is not limited thereto, and the first to the third light emitting diodes OEL-R, OEL-G, and OEL-B may emit light having the same wavelength region or emit light having at least one different wavelength region.

In addition, in an embodiment, all of the first to the third light emitting diodes OEL-R, OEL-G, and OEL-B may emit light in a blue wavelength region. In this case, the display device DD may further include a color control layer on an upper portion of a display diode layer DP-OEL. The color control layer may be a part in which light provided from light emitting diodes OEL-R, OEL-G, and OEL-B is penetrated or a wavelength of the light is converted.

Referring to FIG. 2, the blue light emitting areas PXA-B and the red light emitting areas PXA-R may be arranged along the first directional axis DR1 to constitute a first group PXG1. The green light emitting areas PXA-G may be arranged along the first directional axis DR1 to constitute a second group PXG2. The first group PXG1 and the second group PXG2 may be spaced apart from each other in a direction of the second directional axis DR2. Each of the first group PXG1 and the second group PXG2 may be provided in plurality. The first groups PXG1 and the second groups PXG2 may be arranged alternatively with respect to each other along the second directional axis DR2.

One green light emitting area PXA-G may be spaced apart from one blue light emitting area PXA-B or one red light emitting area PXA-R in a direction of a fourth directional axis DR4. The direction of the fourth directional axis DR4 may be a direction between the direction of the first directional axis DR1 and the direction of the second directional axis DR2.

The arrangement structure of the light emitting areas PXA-B, PXA-G, and PXA-R shown in FIG. 2 may be referred to as a pentile structure. However, the arrangement structure of the light emitting areas PXA-B, PXA-G, and PXA-R in the display device DD according to the present disclosure is not limited to the arrangement structure shown in FIG. 2. For example, in an embodiment, the light emitting areas PXA-B, PXA-G, and PXA-R may have a stripe structure in which a blue light emitting area PXA-B, a green light emitting area PXA-G, and a red light emitting area PXA-R are sequentially and alternately arranged along the first directional axis DR1.

Referring to FIG. 3, the display device DD may include a base substrate BS, a circuit layer DP-CL on the base substrate BS, and the display diode layer DP-OEL. The display diode layer DP-OEL may include the pixel defining film PDL, the light emitting diodes OEL-R, OEL-G, and OEL-B respectively between the pixel defining films PDL, and an encapsulation layer TFE on the light emitting diodes OEL-R, OEL-G, and OEL-B.

The base substrate BS may be a member that provides a base surface on which the display diode layer DP-OEL is located. The base substrate BS may be a glass substrate, a metal substrate, a plastic substrate, etc. However, the present disclosure is not limited thereto, and the base substrate BS may be an inorganic layer, an organic layer, and/or a composite material layer.

In an embodiment, the circuit layer DP-CL is on the base substrate BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting diodes OEL-R, OEL-G, and OEL-B of the display diode layer DP-OEL.

Each of the light emitting diodes OEL-R, OEL-G, and OEL-B may include a first electrode EL1, a hole transport region HTR, an emission layer EML-R, EML-G, and EML-B, an electron transport region ETR, and a second electrode EL2. Each of the light emitting diodes OEL-R, OEL-G, and OEL-B included in the display device DD of an embodiment may have any one structure of the light emitting diodes OEL-1, OEL-2, OEL-3, and OEL-4 (FIGS. 4 to 7) of an embodiment, which will be further described herein below. Each of the light emitting diodes OEL-R, OEL-G, and OEL-B included in the display device DD of an embodiment may include an emission layer having a relatively low refractive index.

FIG. 3 illustrates an embodiment in which the emission layers EML-R, EML-G, and EML-B of the light emitting diodes OEL-R, OEL-G, and OEL-B in the opening holes OH defined in the pixel defining films PDL, and the hole transport region HTR, the electron transport region ETR, and the second electrode EL2 are each provided as a common layer in the entire area of the light emitting diodes OEL-R, OEL-G, and OEL-B. However, the present disclosure is not limited thereto, and unlike the feature illustrated in FIG. 3, the hole transport region HTR or the electron transport region ETR in an embodiment may be divided by (or defined by) the pixel defining film PDL and provided by being patterned inside the opening hole OH defined in the pixel defining film PDL.

The pixel defining film PDL may be formed of a polymer resin. For example, the pixel defining film PDL may include a polyacrylate-based resin and/or a polyimide-based resin. In addition, the pixel defining film PDL may further include inorganic materials in addition to the polymer resin. In some embodiments, the pixel defining film PDL may include a light absorbing material, a black pigment, and/or a black dye. The pixel defining film PDL including the black pigment and/or the black dye may implement a black pixel defining film. In forming the pixel defining film PDL, for example, carbon black may be used as the black pigment and/or the black dye, but the embodiments are not limited thereto.

Also, the pixel defining film PDL may be formed of inorganic materials. For example, the pixel defining film PDL may include silicon nitride (SiNx), silicon oxide (SiOx), silicon oxynitride (SiOxNy), etc. The pixel defining film PDL may define the light emitting areas PXA-R, PXA-G, and PXA-B. The light emitting areas PXA-R, PXA-G, and PXA-B and the non-light emitting areas NPXA may be divided by (or defined by) the pixel defining film PDL.

In an embodiment, the hole transport region HTR, the emission layers EML-R, EML-G, and EML-B, the electron transport region ETR, and the like of the light emitting diodes OEL-R, OEL-G, and OEL-B may be provided by using various suitable methods such as a vacuum deposition method, a spin coating method, a cast method, a Langmuir-Blodgett (LB) method, an inkjet printing method, a laser printing method, and/or a laser induced thermal imaging (LITI) method.

The encapsulation layer TFE may cover the light emitting diodes OEL-R, OEL-G, and OEL-B. The encapsulation layer TFE may seal the display diode layer DP-OEL. The encapsulation layer TFE may be on the second electrode EL2 and may fill the opening hole OH.

The encapsulation layer TFE may be a thin film encapsulation layer. The encapsulation layer TFE may be formed by laminating one layer or a plurality of layers. The encapsulation layer TFE may include at least one insulation layer. The encapsulation layer TFE according to an embodiment of the present disclosure may include at least one inorganic film (hereinafter, referred to as an encapsulation-inorganic film). The encapsulation layer TFE according to an embodiment of the present disclosure may include at least one organic film (hereinafter, referred to as an encapsulation-organic film) and at least one encapsulation-inorganic film.

The encapsulation-inorganic film protects the display diode layer DP-OEL against moisture/oxygen, and the encapsulation-organic film protects the display diode layer DP-OEL against impurities such as dust particles. The encapsulation-inorganic film may include, but is not particularly limited to, a silicon nitride layer, a silicon oxynitride layer, a silicon oxide layer, a titanium oxide layer, and/or an aluminum oxide layer. The encapsulation-organic film may include, but is not particularly limited to, an acrylic-based organic film.

FIGS. 4 to 7 are cross-sectional views showing light emitting diodes of an embodiment. Each of the light emitting diodes OEL-R, OEL-G, and OEL-B included in the display device DD of an embodiment shown in FIG. 3, etc. as described above may have any one structure of the light emitting diodes OEL-1, OEL-2, OEL-3, and OEL-4 shown in FIGS. 4 to 7.

The light emitting diode OEL-1 of an embodiment of the present disclosure includes a first electrode EL1, a hole transport region HTR on an upper portion of the first electrode EL1, an emission layer EML on an upper portion of the hole transport region HTR, and an electron transport region ETR on an upper portion of the emission layer EML; and a second electrode EL2 on an upper portion of the electron transport region ETR, wherein the emission layer EML of the light emitting diode OEL-1 has a relatively low refractive index, for example, lower than that of the hole transport region HTR.

In the light emitting diode OEL-1 of an embodiment, the hole transport region HTR has a first refractive index, and the emission layer EML has a second refractive index, wherein the first refractive index is always larger than the second refractive index, and the difference therebetween (e.g., the difference between the first refractive index and the second refractive index) may be greater than 0.1.

In an embodiment, the first refractive index of the hole transport region HTR may be 1.7 to 2.2, or 1.7 to 2.0. The second refractive index of the emission layer EML may be 1.2 to 1.7, or 1.2 to 1.6.

The light emitting diode OEL-1 of an embodiment may exhibit an improved luminous efficiency characteristic by including a relatively high refractive hole transport region HTR (e.g., a hole transport region HTR having a relatively high refractive index) and a relatively low refractive emission layer EML (e.g., an emission layer EML having a relatively low refractive index). The light emitting diode OEL-1 of an embodiment may include the hole transport region HTR and the emission layer EML which have a refractive index difference to minimize or reduce destructive interference and cancellation of light at the interface between the hole transport region HTR and the emission layer EML and to cause constructive interference, thereby exhibiting high light extraction efficiency.

In an embodiment, the first electrode EL1 has conductivity (e.g., electrical conductivity). The first electrode EL1 may be formed of a metal alloy and/or a conductive compound. The first electrode EL1 may be an anode. In addition, the first electrode EU may be a pixel electrode. The first electrode EU may be a reflective electrode. When the first electrode EL1 is the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, a compound thereof, and/or a mixture thereof (e.g., a mixture of Ag and Mg). In addition, in an embodiment, the first electrode EU may have a structure in which a plurality of layers are stacked. When the first electrode EL1 has a structure in which a plurality of layers are stacked, at least one layer may be a reflection film which is formed of the reflective electrode material. In addition, when the first electrode EL1 has a structure in which a plurality of layers are stacked, at least one layer may include a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The thickness of the first electrode EL1 may be in a range of from about 100 nm to about 1,000 nm, for example, from about 100 nm to about 300 nm.

The hole transport region HTR is on the upper portion of the first electrode EL1. The hole transport region HTR may be a single layer formed of a single material, or a single layer formed of a plurality of different materials. In some embodiments, the hole transport region HTR have may have a multilayer structure having a plurality of layers formed of a plurality of different materials.

Figure 4:
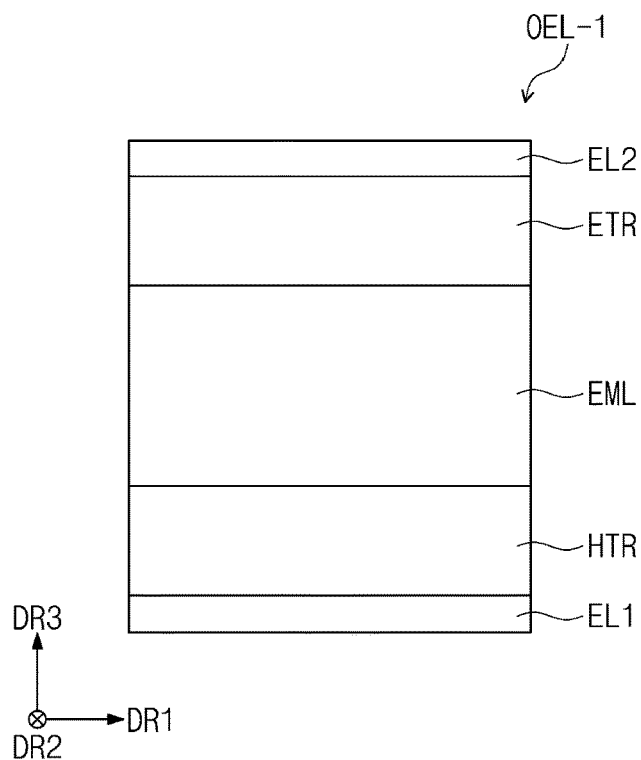
FIG. 4 is a cross-sectional view of a light emitting diode according to an embodiment of the present disclosure.

Referring to FIG. 4, the hole transport region HTR may be a single layer having the first refractive index. The hole transport region HTR may include an organic material having a refractive index of 1.7 to 2.2 to satisfy the first refractive index. The organic material having a refractive index of 1.7 to 2.2 is not specifically limited, and if the hole transport region HTR has the refractive index of the range, the hole transport region HTR may include any suitable organic material generally used in the art without limitation. For example, the hole transport region HTR may include the organic material represented by Formula 1 below:

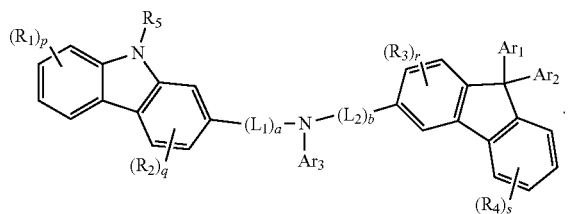

Formula 1

In Formula 1 above, $Ar_1$ and $Ar_2$ may each independently be a hydrogen atom, a deuterium atom, a halogen atom, a substituted or unsubstituted alkyl group having 1 to 30 carbon atoms, a substituted or unsubstituted aryl group having 6 to 30 carbon atoms, or a substituted or unsubstituted heteroaryl group having 2 to 30 ring-forming carbon atoms. In some embodiments, $Ar_1$ and $Ar_2$ may be bonded to an adjacent group to form a ring.

In addition, $Ar_3$ may be a substituted or unsubstituted aryl group having 6 to 30 carbon atoms for forming a ring, or a substituted or unsubstituted heteroaryl group having 2 to 30 carbon atoms for forming a ring.

In Formula 1, a and b may each independently be 0 or 1, and $L_1$ and $L_2$ may each independently be a substituted or unsubstituted cycloalkylene group having 3 to 10 ring-forming carbon atoms, a substituted or unsubstituted hetero cycloalkylene group having 2 to 10 ring-forming carbon atoms, a substituted or unsubstituted cycloalkenylene group having 3 to 10 ring-forming carbon atoms, a substituted or unsubstituted arylene group having 6 to 30 ring-forming carbon atoms, or a substituted or unsubstituted heteroarylene group having 2 to 60 ring-forming carbon atoms.

In Formula 1, p and s may each independently be an integer of 0 to 4, q and r may each independently be an integer of 0 to 3, and $R_1$ to $R_5$ may each independently be a hydrogen atom, a deuterium atom, a halogen atom, a hydroxy group, a cyano group, a nitro group, an amino group, a substituted or unsubstituted silyl group, a substituted or unsubstituted oxy group, a substituted or unsubstituted alkyl group having 1 to 60 carbon atoms, a substituted or unsubstituted hetero cycloalkyl group having 3 to 60 ring-forming carbon atoms, a substituted or unsubstituted aryl group having 6 to 60 ring-forming carbon atoms, or a substituted or unsubstituted heteroaryl group having 2 to 60 ring-forming carbon atoms.

Figure 6:
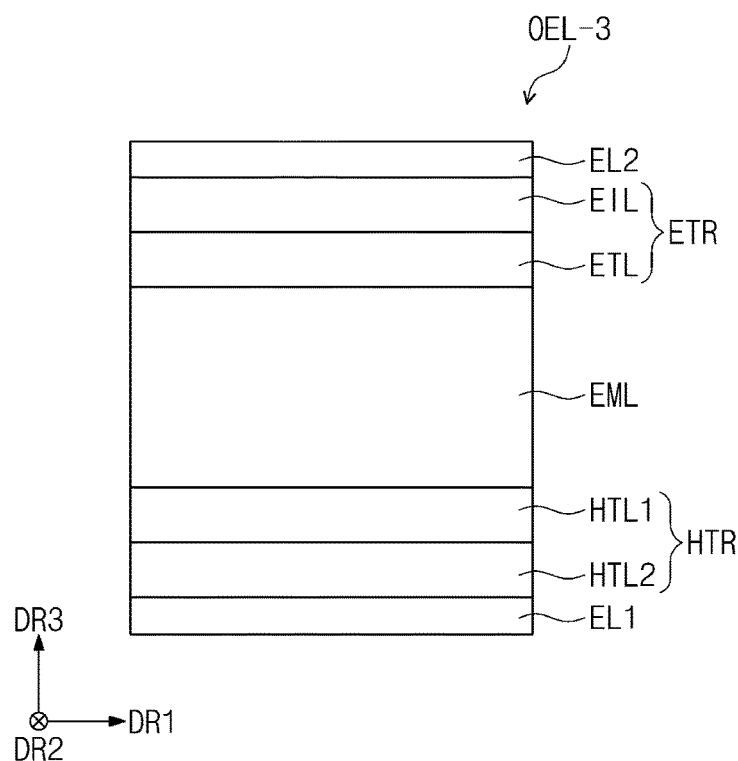
FIG. 6 is a cross-sectional view of a light emitting diode according to an embodiment of the present disclosure.

Referring to FIG. 6, the hole transport region HTR of the light emitting diode OEL-3 according to an embodiment may have a multilayer structure including a first hole transport layer HTL1 and a second hole transport layer HTL2. The structure of the hole transport region HTR, however, is not limited thereto, and the hole transport region HTR may further include a third hole transport layer, etc. When the hole transport region HTR has the multilayer structure, the first hole transport layer HTL1 directly on the lower portion of the emission layer EML may have the first refractive index. The second hole transport layer HTL2 which is not directly on the emission layer EML is not limited to a specific refractive index.

The terms "directly on" or "directly disposed on," as used herein, means that there are no intervening layers, films, areas, plates, or the like between a part such as a layer, a film, an area, and a plate and another part. For example, being "directly on" or "directly disposed on" may mean being between two layers without using an additional member, such as an adhesive member.

The thickness of the hole transport region HTR may be in a range of from about 10 nm to about 1000 nm, for example, from about 10 nm to about 500 nm. When the hole transport region HTR has the multilayer structure, each of the first hole transport layer HTL1 and the second hole transport layer HTL2 may be in a range of from about 3 nm to about 500 nm, or about 3 nm to about 100 nm. However, the present disclosure is not limited thereto, the thickness of the hole transport region HTR may be adjusted according to a wavelength region of light emitted from the emission layer EML, a display quality required or desired from the display device DD (FIG. 2), and/or the kinds or composition of a hole transport material used in the hole transport region HTR.

Referring to FIG. 4 again, the emission layer EML is on the upper portion of the hole transport region HTR. The emission layer EML has the second refractive index, and may be directly on the upper portion of the hole transport region HTR. The emission layer EML may be a single layer formed of a single material, or a single layer formed of a plurality of different materials.

The emission layer EML may include an organic material having a refractive index of 1.2 to 1.7 to satisfy the second refractive index. Kinds or compositions of the organic material having a refractive index of 1.2 to 1.7 are not specifically limited, and may include, for example, at least one selected from among the compounds represented by Formulae 2-1 to 2-4 below. However, the emission layer EML may not include an inorganic material.

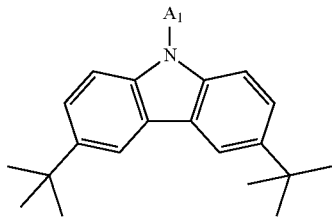

2-1

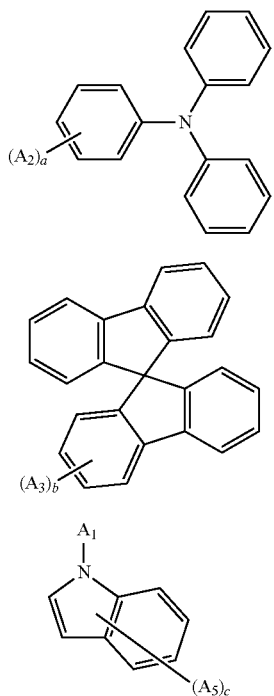

In Formulae 2-1 to 2-4, $A_1$ to $A_5$ may each independently be a hydrogen atom, a deuterium atom, a halogen atom, a hydroxy group, a cyano group, a nitro group, an amino group, a substituted or unsubstituted silyl group, a substituted or unsubstituted oxy group, a substituted or unsubstituted alkyl group having 1 to 60 carbon atoms, a substituted or unsubstituted aryl group having 6 to 60 ring-forming carbon atoms, or a substituted or unsubstituted heteroaryl group having 2 to 60 ring-forming carbon atoms. In Formula 1-2, a may be an integer of 0 to 5, in Formula 1-3, b may be an integer of 0 to 4, and in Formula 1-4, and c may be an integer of 0 to 6.

The emission layer EML may emit one of red, green, blue, white, yellow or cyan light. The emission layer EML may further include an organic light emitting material. The organic light emitting material may be a fluorescence-emitting material or a phosphorescence-emitting material. Kinds or compositions of the organic light emitting material are not specifically limited, and may include any suitable light emitting materials generally used in the art. The emission layer EML may include, for example, anthracene derivatives, pyrene derivatives, fluoranthene derivatives, chrysene derivatives, dihydrobenzanthracene derivatives, and/or triphenylene derivatives. In some embodiments, the emission layer EML may include anthracene derivatives and/or pyrene derivatives.

Figure 5:
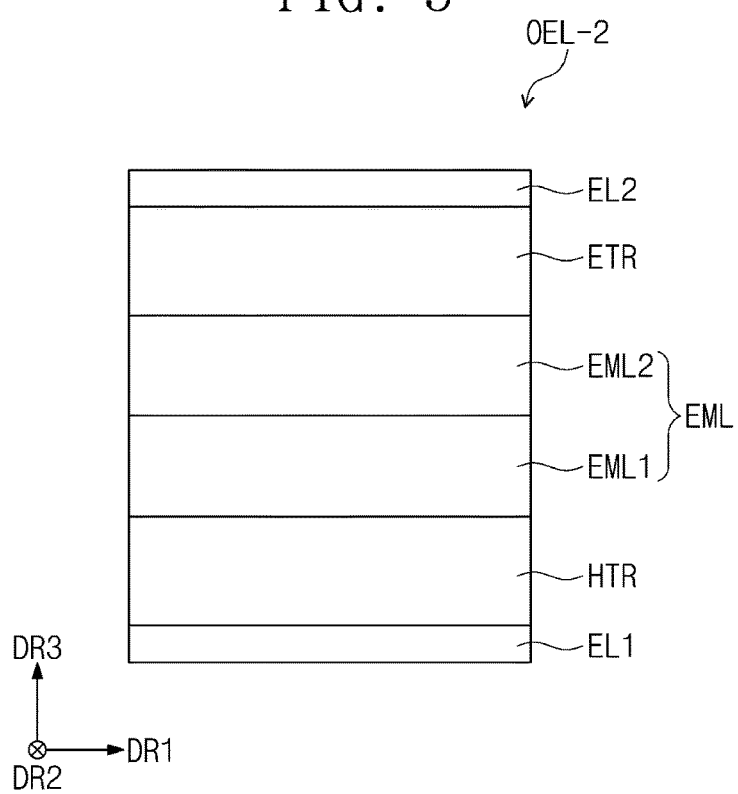
FIG. 5 is a cross-sectional view of a light emitting diode according to an embodiment of the present disclosure.

Referring to FIG. 5, the emission layer EML of the light emitting diode OEL-2 according to an embodiment may have a multilayer structure including a first emission layer EML1 and a second emission layer EML2. However, the embodiments are not limited thereto, and the emission layer EML may further include a third emission layer, etc. When the emission layer EML has the multilayer structure, each of the emission layers EML1 and EML2 may emit light having the same (e.g., substantially the same) center wavelength. To this end, each of the emission layers EML1 and EML2 may include the same (e.g., substantially the same) organic light emitting material.

In the emission layer EML of the multilayer structure, the first emission layer EML1 directly on the upper portion of the hole transport region HTR may have the second refractive index. The second emission layer EML2 may be on the upper portion of the first emission layer EML1 and may have a third refractive index. The third refractive index may be equal to or greater than the second refractive index, and may be in a range of, for example, 1.2 to 2.0, or 1.2 to 1.8.

In an embodiment, the thickness of the emission layer EML may be in a range of from about 10 nm to about 60 nm or from about 10 nm to about 30 nm. When the emission layer EML has the multilayer structure, the sum of the thicknesses of the emission layers may be in a range of from about 10 nm to about 60 nm.

In an embodiment, when the emission layer EML includes the first emission layer EML1 and the second emission layer EML2, the sum of the thicknesses of the first emission layer EML1 and the second emission layer EML2 may be in a range of from about 10 nm to about 60 nm or from about 10 nm to about 30 nm. FIG. 5 shows that the thickness ratio of the first emission layer EML1 and the second emission layer EML2 is 1:1, but the present disclosure is not limited thereto, and the thickness ratio of the first emission layer EML1 and the second emission layer EML2 may be in a range of, for example, 1:9 to 9:1.

Referring to FIG. 4 again, the electron transport region ETR is on the upper portion of the emission layer EML. The electron transport region ETR may include at least one selected from a hole blocking layer, an electron transport layer, and an electron injection layer, but the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer/electron injection layer and a hole blocking layer/electron transport layer/electron injection layer are stacked in order from the emission layer, but is not limited thereto. The thickness of the electron transport region ETR may be in a range of, for example, from about 100 nm to about 150 nm.

When the electron transport region ETR includes the electron injection layer EIL, the electron transport region ETR may be formed using metal halides such as LiF, NaCl, CsF, RbCl, RbI, and/or CuI, lanthanum metals such as Yb, metal oxides such as $Li_2O$ and/or BaO, lithium quinolate (LiQ), etc., but the present disclosure is not limited thereto. The electron injection layer EIL may be formed of a mixture of the material for the electron transport material and an organo metal salt. The organo-metal salt may be a material having an energy band gap of about 4 eV or more. In some embodiments, the organo-metal salt may include, for example, metal acetates, metal benzoates, metal acetoacetates, metal acetylacetonates, and/or metal stearates. When the electron transport region ETR includes the electron transport layer ETL, the electron transport layer ETL may include an anthracene-based compound. However, the present disclosure is not limited thereto, and the electron transport layer ETL may include any suitable electron transport material generally used in the art.

The second electrode EL2 is on the upper portion of the electron transport region ETR. The second electrode EL2 may be a common electrode or a cathode. The second electrode EL2 may be a transmissive electrode or a transflective electrode. When the second electrode EL2 is the transmissive electrode, the second electrode EL2 may include a transparent metal oxide, for example, ITO, IZO, ZnO, ITZO, etc. When the second electrode EL2 is the transflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, and/or a mixture thereof (e.g., a mixture of Ag and Mg). In some embodiments, the second electrode EL2 may have a multi-layer structure including a reflective layer or a transflective layer formed of the above-described materials, and a transparent conductive layer formed of ITO, IZO, ZnO, ITZO, etc.

Figure 7:
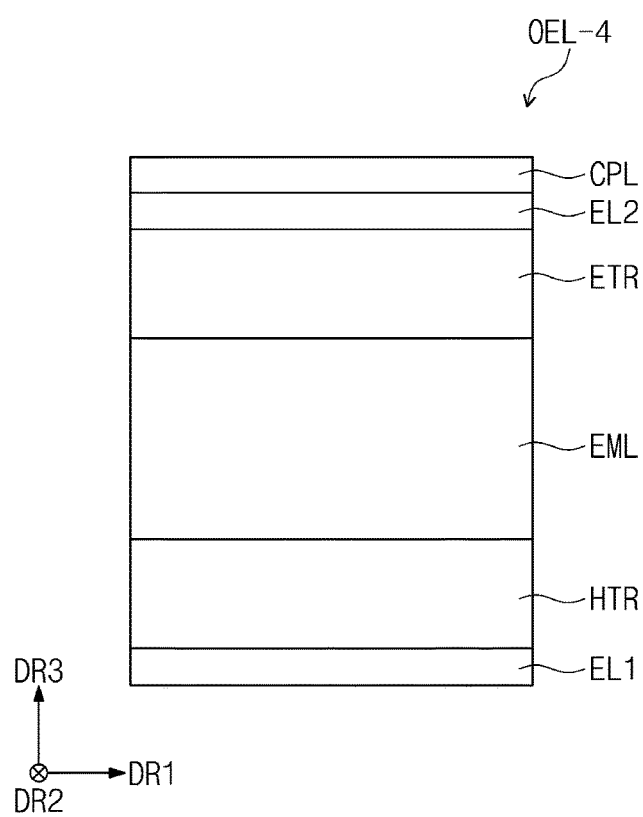
FIG. 7 is a cross-sectional view of a light emitting diode according to an embodiment of the present disclosure.

Referring to FIG. 7, the light emitting diode OEL-4 of an embodiment may further include a capping layer CPL on the second electrode EL2. When including the capping layer CPL, the light emitting diode OEL-4 may improve light extraction efficiency due to an interference effect (e.g., a constructive interference effect) of light. The capping layer CPL may include, for example, α-NPD, NPB, TPD, m-MTDATA, Alq3, CuPc, N4,N4,N4',N4'-tetra(biphenyl-4-yl)biphenyl-4,4'-diamine (TPD15), 4,4',4"-tris(carbazol-9-yl)triphenylamine (TCTA), etc.

The display device of an embodiment may include a plurality of light emitting diodes, and at least one light emitting diode of the plurality of the light emitting diodes may have a constitution of the light emitting diode according to an embodiment as described above.

Referring to FIG. 3 again, the display device DD of an embodiment includes the first to the third light emitting diodes OEL-R, OEL-G, and OEL-B divided by (or defined by) the pixel defining film PDL, and the first to the third light emitting diodes OEL-R, OEL-G, and OEL-B may have different constitutions of the emission layers EML-R, EML-G, and EML-B, and may emit light having different center wavelengths. Any one light emitting diode among the first to the third light emitting diodes OEL-R, OEL-G, and OEL-B may have constitutions of the light emitting diodes in FIGS. 4 to 7 as described above. In some embodiments, two light emitting diodes or three light emitting diodes selected from among the first to the third light emitting diodes OEL-R, OEL-G, and OEL-B may have constitutions of the light emitting diodes in FIGS. 4 to 7 as described above.

When all three light emitting diodes OEL-R, OEL-G, and OEL-B in the display device DD of an embodiment have the constitutions of FIGS. 4 to 7 as described above, the hole transport region HTR may be provided for all of the first to the third light emitting diodes OEL-R, OEL-G, and OEL-B as a common layer.

In some embodiments, the hole transport region HTR in the display device DD of an embodiment is in the opening hole OH defined in the pixel defining film PDL unlike the feature illustrated in FIG. 3, and may be provided to correspond to the emission layers EML-B, EML-G, and EML-R.

Figure 8:
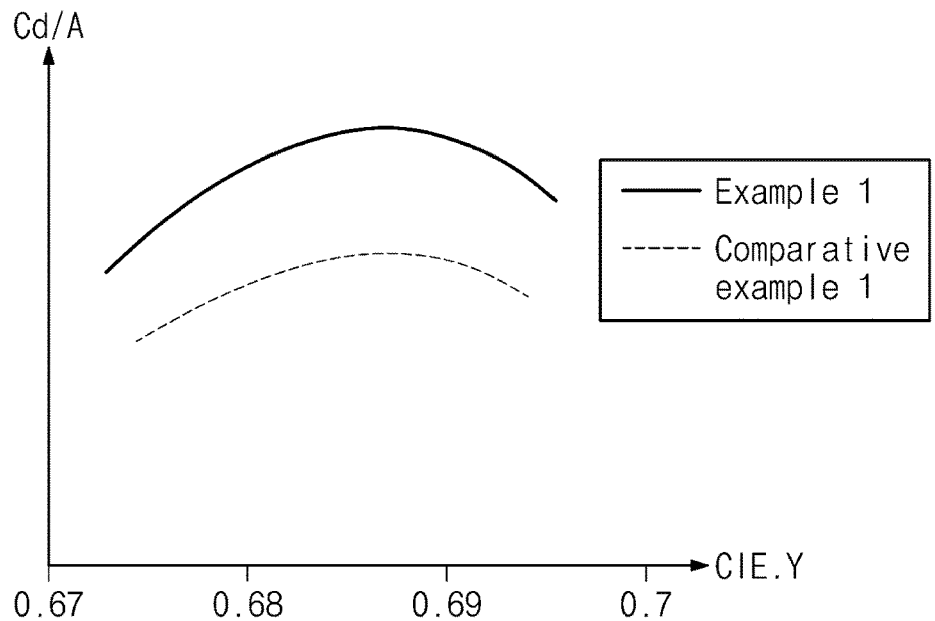
FIG. 8 is a graph illustrating efficiency characteristics in light emitting diodes, comparing the light emitting diodes of Comparative Example 1 and Example 1.
Figure 9:
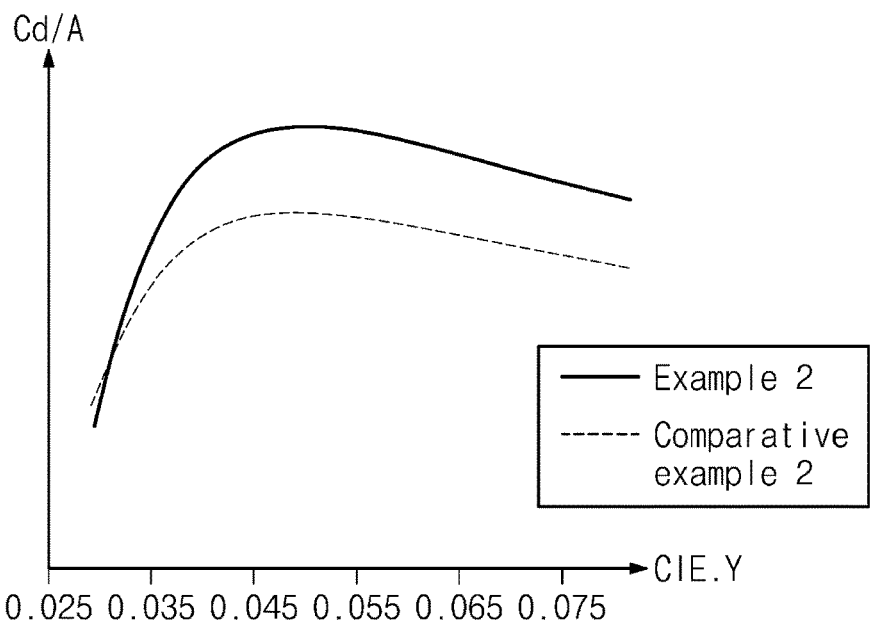
FIG. 9 is a graph illustrating efficiency characteristics in light emitting diodes, comparing the light emitting diodes of Comparative Example 2 and Example 2.
Figure 10:
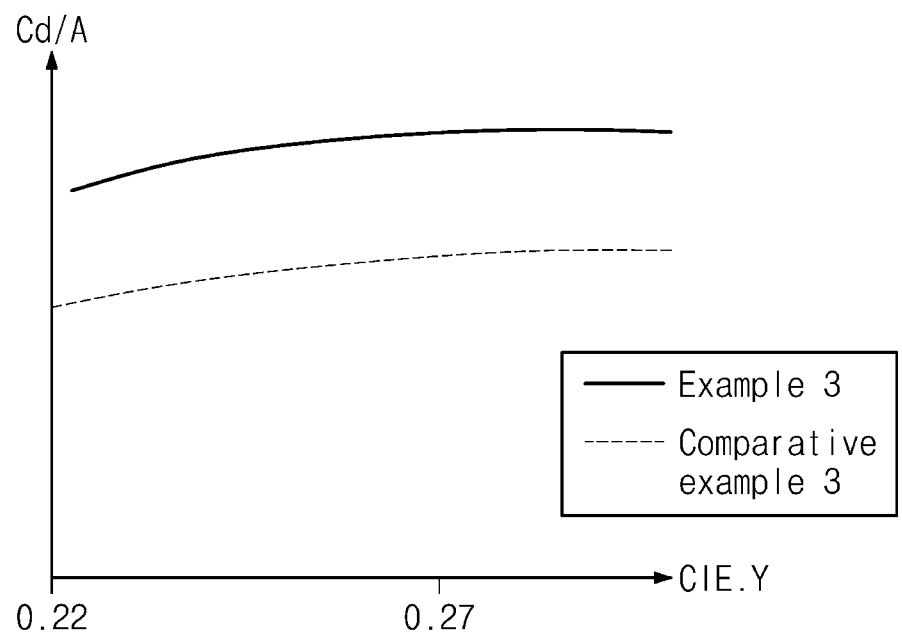
FIG. 10 is a graph illustrating efficiency characteristics in light emitting diodes, comparing the light emitting diodes of Comparative Example 3 and Example 3.

FIGS. 8 to 10 are graphs illustrating a luminous efficiency by comparing the luminous efficiencies of Comparative Examples and Examples. Examples 1 to 3 are evaluation results with respect to the light emitting diode having the first emission layer having a refractive index of 1.4 and the second emission layer having a refractive index of 1.85 as FIG. 5, and Comparative Examples 1 to 3 are evaluation results with respect to the light emitting diode having a single emission layer having a refractive index of 1.85. In the Examples and the Comparative Examples, the constitution of the functional layers of the light emitting diodes is the same except for the different constitutions of the emission layer. Comparative Example 1 and Example 1 of FIG. 8 correspond to the light emitting diode which emits light having a center wavelength of about 625 nm to about 675 nm, Comparative Example 2 and Example 2 of FIG. 9 correspond to the light emitting diode which emits light having a center wavelength of about 500 nm to about 570 nm, and Comparative Example 3 and Example 3 of FIG. 10 correspond to the light emitting diode which emits light having a center wavelength of about 410 nm to about 480 nm.

In FIGS. 8 to 10, a horizontal axis is a color coordinate value corresponding to "y" values in the color coordinate of light emitted from the light emitting diode, and a vertical axis represents a luminous efficiency according to the color coordinates of light emitted from the light emitting diode.

In FIG. 8, when the color coordinate of the horizontal axis is 0.685, the efficiency value of the vertical axis is determined to be 1 in Comparative Example 1 and to be 1.4 in Example 1. Therefore, it can be seen that the maximum luminous efficiency in Example 1 was improved by about 40% compared to Comparative Example 1.

In FIG. 9, when the color coordinate of the horizontal axis is 0.250, the efficiency value of the vertical axis is determined to be 1 in Comparative Example 2 and to be 1.4 in Example 2. Therefore, it can be seen that the maximum luminous efficiency in Example 2 was improved by about 40% compared to Comparative Example 2.

In FIG. 10, when the color coordinate of the horizontal axis is 0.250, the efficiency value of the vertical axis is determined to be 1 in Comparative Example 3 and to be 1.24 in Example 3. Therefore, it can be seen that the maximum luminous efficiency in Example 3 was improved by about 24% compared to Comparative Example 3.

The light emitting diode of an embodiment may exhibit high light extraction efficiency by including a stacked structure of a high refractive hole transport region/low refractive emission layer, thereby exhibiting an excellent luminous efficiency characteristic.

The light emitting diodes according to an embodiment of the present disclosure may exhibit an improved light extract characteristic by including the emission layer having a relatively low refractive index.

The display device according to an embodiment of the present disclosure may exhibit excellent luminous efficiency by including the light emitting diode including the emission layer having a relatively low refractive index.

Although the subject matter of the present disclosure has been described with reference to certain embodiments, it will be understood that the present disclosure should not be limited to the disclosed embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting diode comprising:
   a first electrode;
   a hole transport region on an upper portion of the first electrode and having a first refractive index;

an emission layer on an upper portion of the hole transport region;

an electron transport region on an upper portion of the emission layer; and a second electrode on an upper portion of the electron transport region, wherein the emission layer comprises:

a first emission layer directly on the hole transport region; and a second emission layer on the first emission layer, wherein the first emission layer has a second refractive index less than the first refractive index, and wherein the second emission layer has a third refractive index greater than the second refractive index.

2. The light emitting diode of claim 1, wherein the difference between the first refractive index and the second refractive index is greater than 0.1, and the third refractive index is in a range of 1.2 to 2.0.

3. The light emitting diode of claim 2, wherein the first refractive index is in a range of 1.7 to 2.2, and the second refractive index is in a range of 1.2 to 1.7.

4. The light emitting diode of claim 3, wherein the emission layer comprises an organic material which has a refractive index of in a range 1.2 to 1.7 and an organic emitting material.

5. The light emitting diode of claim 1, wherein the third refractive index is in a range of 1.2 to 2.0.

6. The light emitting diode of claim 1, wherein the thickness ratio of the first emission layer to the second emission layer is in a range of 1:9 to 9:1.

7. The light emitting diode of claim 6, wherein the sum of the thickness of the first emission layer and the thickness of the second emission layer is in a range of 10 nm to 60 nm.

8. The light emitting diode of claim 1, wherein the first emission layer and the second emission layer emit light having the same center wavelength.

9. The light emitting diode of claim 1, wherein the hole transport region comprises:

a first hole transport layer directly on a lower portion of the emission layer; and a second hole transport layer on a lower portion of the first hole transport layer, wherein the first hole transport layer has the first refractive index.

10. The light emitting diode of claim 1, wherein the first electrode is a reflective electrode, and the second electrode is a transmissive electrode or a transflective electrode.

11. The light emitting diode of claim 1, further comprising a capping layer on an upper portion of the second electrode.

12. A light emitting diode comprising:

a first electrode;

a hole transport region on an upper portion of the first electrode and having a first refractive index;

a first emission layer on an upper portion of the hole transport region and having a second refractive index;

a second emission layer on an upper portion of the first emission layer;

an electron transport region on an upper portion of the second emission layer; and a second electrode on an upper portion of the electron transport region, wherein the first refractive index is greater than the second refractive index by 0.1 or more, and wherein the second emission layer has a third refractive index greater than the second refractive index.

13. The light emitting diode of claim 12, wherein the first refractive index is in a range of 1.7 to 2.2, and the second refractive index is in a range of 1.2 to 1.7.

14. The light emitting diode of claim 12, wherein the thickness ratio of the first emission layer to the second emission layer is in a range of 1:9 to 9:1.

15. The light emitting diode of claim 14, wherein the sum of the thickness of the first emission layer and the thickness of the second emission layer is in a range of 10 nm to 60 nm.

16. A display device comprising a plurality of light emitting diodes, each of the light emitting diodes comprising:

a first electrode;

a hole transport region on an upper portion of the first electrode and having a first refractive index;

an emission layer on an upper portion of the hole transport region;

an electron transport region on an upper portion of the emission layer; and a second electrode on an upper portion of the electron transport region, wherein each of the light emitting diodes emits light having different center wavelengths, wherein the emission layer comprises:

a first emission layer directly on the hole transport region; and a second emission layer on the first emission layer, wherein the first emission layer has a second refractive index less than the first refractive index, and wherein the second emission layer has a third refractive index greater than the second refractive index.

17. The light emitting diode of claim 16, wherein the difference between the first refractive index and the second refractive index is greater than 0.1.

18. The light emitting diode of claim 16, wherein the first electrode is a reflective electrode, and the second electrode is a transmissive electrode or a transflective electrode.

* * * * *

UNITED STATES PATENT AND TRADEMARK OFFICE
CERTIFICATE OF CORRECTION

PATENT NO. : 11,495,778 B2
APPLICATION NO. : 17/093284
DATED : November 8, 2022
INVENTOR(S) : Bora Lee et al.

It is certified that error appears in the above-identified patent and that said Letters Patent is hereby corrected as shown below:

In the Claims
Column 17, Line 24, Claim 4          Before "1.2"
                                     Insert -- of --

Signed and Sealed this
Twenty-ninth Day of August, 2023

*Katherine Kelly Vidal*

Katherine Kelly Vidal
*Director of the United States Patent and Trademark Office*